(12) United States Patent
Wong et al.

(10) Patent No.: US 10,854,787 B2
(45) Date of Patent: Dec. 1, 2020

(54) COMPONENT HAVING BOUNDARY ELEMENT

(71) Applicant: OSRAM Opto Semiconductors GmbH, Regensburg (DE)

(72) Inventors: Teik Yee Wong, Penang (MY); Chee Weng Soong, Penang (MY); Rajah Prakash, Penang (MY); Christian Betthausen, Regensburg (DE); Chee-Eng Ooi, Penang (MY); Ismail Ithnain, Penang (MY); Choo Kean Lim, Penang (MY); Weng Heng Chan, Penang (MY)

(73) Assignee: OSAM OLED GMBH, Regensburg (DE)

( * ) Notice: Subject to any disclaimer, the term of this patent is extended or adjusted under 35 U.S.C. 154(b) by 0 days.

(21) Appl. No.: 16/052,511

(22) Filed: Aug. 1, 2018

(65) Prior Publication Data
US 2019/0044033 A1    Feb. 7, 2019

(30) Foreign Application Priority Data
Aug. 3, 2017 (DE) .................. 10 2017 117 628

(51) Int. Cl.
*H01L 33/48* (2010.01)
*H01L 33/20* (2010.01)
(Continued)

(52) U.S. Cl.
CPC ............ *H01L 33/486* (2013.01); *H01L 33/20* (2013.01); *H01L 33/46* (2013.01); *H01L 33/54* (2013.01);
(Continued)

(58) Field of Classification Search
CPC ....... H01L 33/486; H01L 33/20; H01L 33/46; H01L 33/54; H01L 33/56; H01L 33/60; H01L 2224/48247; H01L 2924/00
See application file for complete search history.

(56) References Cited

U.S. PATENT DOCUMENTS

| | | | |
|---|---|---|---|
| 9,357,641 B2 | 5/2016 | Sasaoka et al. | |
| 2008/0054287 A1* | 3/2008 | Oshio | H01L 33/60 257/99 |

(Continued)

FOREIGN PATENT DOCUMENTS

| | | |
|---|---|---|
| DE | 102012215705 A1 | 3/2014 |
| DE | 102013221429 A1 | 5/2015 |

OTHER PUBLICATIONS

"Middle Power LED Series, LM301B CRI80," Product Family Dta Sheet, Rev. 1.1 Jul. 24, 2017, 26 pages.

*Primary Examiner* — Patricia D Reddington
(74) *Attorney, Agent, or Firm* — Slater Matsil, LLP (57) ABSTRACT

A component having a boundary element is disclosed. In an embodiment a component comprises a semiconductor chip, a housing and a reflective layer, wherein the housing has a shaped body and a base body, the shaped body laterally enclosing the base body at least in places and being different from the reflective layer. In a plan view, the base body has a free area which is uncovered by the shaped body. The free area or a bottom surface of a cavity comprises a mounting surface for the semiconductor chip, wherein the semiconductor chip is arranged on the mounting surface. The bottom surface or the free area is partially covered by the reflective layer, wherein the mounting surface is enclosed at least in regions by a boundary element which adjoins the reflective layer and is configured to prevent the semiconductor chip from being covered by the reflective layer.

20 Claims, 5 Drawing Sheets

(51) Int. Cl.
*H01L 33/46* (2010.01)
*H01L 33/54* (2010.01)
*H01L 33/56* (2010.01)
*H01L 33/60* (2010.01)
*H01L 25/075* (2006.01)

(52) U.S. Cl.
CPC .............. *H01L 33/56* (2013.01); *H01L 33/60* (2013.01); *H01L 25/0753* (2013.01); *H01L 2224/48247* (2013.01); *H01L 2924/00* (2013.01); *H01L 2933/005* (2013.01); *H01L 2933/0033* (2013.01); *H01L 2933/0058* (2013.01); *H01L 2933/0066* (2013.01)

(56) References Cited

U.S. PATENT DOCUMENTS

| | | |
|---|---|---|
| 2010/0193822 A1 | 8/2010 | Inobe et al. |
| 2013/0161665 A1* | 6/2013 | Kuwaharada ........... H01L 33/54 257/88 |
| 2016/0155911 A1 | 6/2016 | Abe |
| 2017/0054061 A1* | 2/2017 | Naka ....................... H01L 33/56 |
| 2017/0222092 A1 | 8/2017 | Gebuhr et al. |

* cited by examiner

COMPONENT HAVING BOUNDARY ELEMENT

CROSS-REFERENCE TO RELATED APPLICATIONS

This application claims the priority of German patent application 10 2017 117 628.4, filed Aug. 3, 2017, which is incorporated herein by reference in its entirety.

TECHNICAL FIELD

A component having high efficiency is provided. Furthermore, a method for producing such a component is provided.

BACKGROUND

In a component having a semiconductor chip and a housing, wherein the semiconductor chip is disposed within a cavity of the housing, the electromagnetic radiation generated by the semiconductor chip can be absorbed at side walls of the cavity. In order to increase the reflectance of the side walls, the housing can be made of a material containing reflective or scattering particles embedded therein. Since the material of the housing has to meet further requirements, for example, with regard to breaking strength, tensile strength or compressive strength, it is not possible to achieve a particularly high degree of reflection on the side walls of the cavity. In order to further increase the performance of the component, a bottom surface of the cavity can be coated with a silver layer. However, such a metal layer corrodes easily, for example, by oxidation, so that its reflectance decreases rapidly over time.

SUMMARY

Embodiments provide a component having high efficiency. Further embodiments provide a simplified method for producing such a component.

According to at least one embodiment of a component, it has a semiconductor chip, a housing and a reflective layer. The reflective layer may be electrically insulating. The housing has a shaped body and a base body, wherein the shaped body laterally encloses the base body at least partially or completely. In particular, the shaped body is different from the reflective layer. The shaped body can be configured to be radiation-absorptive with regard to the electromagnetic radiation generated during operation of the semiconductor chip. The base body can be metallic or made of one or more metals.

In particular, the base body may have a free area when viewed from above. A free area of the base body is understood to mean in particular a part of the surface of the base body uncovered by the shaped body. The free area may include a mounting surface configured for mounting the semiconductor chip or a plurality of semiconductor chips. The mounting surface can be only a partial region of the free area. While the mounting surface is particularly uncovered by the reflective layer, the free area can be covered by the reflective layer in places. For example, another partial region of the free area surrounding the mounting surface is covered by the reflective layer.

According to at least one embodiment of the component, the housing has a further base body. In particular, the further base body may be laterally spaced apart from the base body. Analogous to the base body, the further base body can be laterally enclosed by the shaped body completely or in places. The further base body can have a further free area which is uncovered by the shaped body. In particular, the mounting surface is different from the further free area of the further base body. For example, the additional free area is not intended for the assembly of radiation-emitting devices. However, other devices such as protective diodes may be arranged on the further free area. The further free area may be covered, in particular completely covered, by the reflective layer.

According to at least one embodiment of the component, the housing has a cavity. In particular, the cavity of the housing is laterally enclosed, in particular completely enclosed, by the shaped body. For example, side walls of the cavity are formed by surfaces of the shaped body. The free area of the base body can form a bottom surface of the cavity at least in places. In other words, the free area of the base body can form a partial region of the bottom surface of the cavity.

According to at least one embodiment of the component, the shaped body is configured in such a way that it laterally surrounds the base body at least in places, wherein at least in certain regions the shaped body and the base body have the same vertical height. The shaped body and the base body have the same vertical height if the vertical height of the shaped body and the vertical height of the base body are the same within the manufacturing tolerances. In particular, the vertical height of the shaped body may differ from the vertical height of the base body by at most 1%, 3% or 5%.

According to at least one embodiment of the component, the shaped body is flush with the base body along one or several lateral directions. In particular, the shaped body does not vertically protrude or does not significantly protrude above the base body, for example, on the sides of the free area.

If the shaped body and the base body have substantially the same vertical heights or if the shaped body is flush with the base body in one or several lateral directions, the shaped body may not form a cavity whose bottom surface is formed at least in places by the free area of the base body. In this case, the shaped body may not protrude beyond the free area of the base body and thus does not form a cavity of the housing on the free area of the base body.

According to at least one embodiment of the component, the shaped body can be contiguous and, in particular, one-piece. Preferably, the shaped body differs from the reflective layer. In other words, the shaped body and the reflective layer can have different material compositions. In particular, the shaped body is void of radiation-reflective particles or has a reflectance lower than a reflectance of the reflective layer by at least 5%, 10%, 20%, 30% or 40%. For example, the shaped body can be formed to be radiation-absorptive.

Alternatively, it is possible for the shaped body to be formed from a reflective material. For example, the shaped body can be made of a matrix material, such as silicone or epoxy material, having white particles embedded therein. Such shaped bodies or housings usually have a reflectance of 92%, 90%, 80% or 70% at most. By covering with the reflective layer, the reflectance of the shaped body or housing can be increased by several percentage points, for example, by at least 3%, 5%, 10%, 20% or 30%. The semiconductor chip is located for instance inside the cavity of the housing. The reflective layer can partially or completely cover a bottom surface and/or side walls of the cavity.

According to at least one embodiment of the component, the free area or a bottom surface of the cavity comprises a mounting area for the semiconductor chip or for a plurality of semiconductor chips. The mounting surface is thus part of the free area and/or the bottom surface of the cavity. Within the cavity, the semiconductor chip is located for instance on the mounting surface. The free area and/or bottom surface can be partially covered by the reflective layer. Preferably, the semiconductor chip and/or the mounting surface are/is free of a covering by the reflective layer.

According to at least one embodiment of the component, it has a boundary element. In particular, the mounting surface may be completely or partially enclosed by the boundary element. In particular, the boundary element may be adjacent to the reflective layer. In a plan view, the reflective layer can partially or completely cover the boundary element. The boundary element may be configured to prevent the mounting surface and/or the semiconductor chip from being covered by the reflective layer.

In a plan view of the mounting surface or the bottom surface of the cavity, the semiconductor chip may be laterally spaced from the reflective layer. Both a front side facing away from the mounting surface and side surfaces of the semiconductor chip can be free of a covering by the reflective layer. For example, the semiconductor chip is a volume emitter, wherein radiation emitted during operation of the semiconductor chip can be coupled out from the semiconductor chip not only via the front side but also via the side surfaces. The component can have a plurality of semiconductor chips arranged on the mounting surface. In particular, the mounting surface is the part of the bottom surface which is surrounded, in particular completely surrounded, by the boundary element.

In at least one embodiment of the component, it has a semiconductor chip, a housing and a reflective layer. The housing may have a shaped body and a base body, wherein the shaped body laterally surrounds the base body at least in places and is different from the reflective layer. In a plan view, the base body may have a free area which is not covered by the shaped body and may comprise a mounting surface for the semiconductor chip, wherein the semiconductor chip is arranged on the mounting surface. The free area may be partially covered by the reflective layer. The mounting surface is enclosed by a boundary element at least in places, wherein the boundary element adjoins the reflective layer and may be configured to prevent the semiconductor chip from being covered by the reflective layer.

In a further embodiment of the component, the housing has a cavity, wherein the shaped body surrounds the cavity of the housing laterally and is different from the reflective layer. The cavity has a bottom surface having a mounting surface for the semiconductor chip, wherein the semiconductor chip is arranged in the cavity on the mounting surface. In particular, the mounting surface is a partial region of the free area of the base body, wherein the free area can in turn be a partial region of the bottom surface of the cavity. The bottom surface is partially covered by the reflective layer. The mounting surface is enclosed by a boundary element at least in places, wherein the boundary element adjoins the reflective layer and is configured to prevent the semiconductor chip from being covered by the reflective layer.

The boundary element allows a material of the radiation-reflective layer to be kept away from the semiconductor chip or from the mounting surface. In the case of a volume emitter, this is particularly useful, since the radiation emitted during operation of the semiconductor chip can be coupled out on all uncovered surfaces of the semiconductor chip. Due to the presence of the boundary element, the reflective layer can be easily applied onto the free area, the bottom surface and/or the side walls of the cavity. The reflective layer can be formed in the presence of the semiconductor chip without the semiconductor chip being partially covered by the reflective layer. The semiconductor chip or the plurality of semiconductor chips can first be attached to and/or electrically contacted on the mounting surface, wherein even after the semiconductor chip has been attached and/or contacted, the reflective layer can still be applied to the free area and/or to the bottom surface or to the side walls of the cavity without the risk of undesired covering of the semiconductor chip.

According to at least one embodiment of the component, the boundary element is a recess on the free area of the base body and/or of the bottom surface of the cavity. In this case, the mounting surface is a vertically elevated surface of the free area and/or of the bottom surface, wherein the mounting surface is completely or partially surrounded by the recess. Along a lateral direction, the recess may extend from the mounting surface as far as a lateral margin line of the free area and/or as far as a side wall of the cavity. It is possible for the recess to extend along the lateral directions from the mounting surface to two opposite or adjacent side walls of the cavity and/or lateral margin lines of the free area. In a plan view of the free area or of the bottom surface, it is possible for the recess to be arranged between the mounting surface and the margin lines of the free area or the side walls of the cavity. In a plan view, the boundary element may be laterally spaced both from the semiconductor chip and from all margin lines of the free area or from all side walls of the cavity.

A vertical direction is generally understood to mean a direction that is directed transverse, in particular perpendicular, to the free area or to the bottom surface or to the mounting surface. A lateral direction, on the other hand, is a direction that runs along, in particular parallel, to the free area or to the bottom surface or to the mounting surface. The vertical direction and the lateral direction are in particular perpendicular to each other.

The recess may have a vertical depth and/or a lateral width between 10 µm and 200 µm inclusive, for example, between 10 µm and 100 µm inclusive, for instance about 50 µm. Since the mounting surface is vertically elevated with respect to the recess, the recess serves as a collecting basin for the material of the reflective layer. This prevents the material of the reflective layer from creeping onto the mounting surface or onto the semiconductor chip.

The mounting surface is particularly preferred to be connected to a bottom surface of the recess via an intermediate surface extending along the vertical direction, wherein the intermediate surface is convexly or concavely curved. Alternatively, it is possible that the intermediate surface forms an acute angle with the bottom surface of the recess covered by the reflective layer. The acute angle can be between 20° and 80° inclusive or between 30° and 70° inclusive. Such an inclined or curved intermediate surface additionally prevents the material of the reflective layer from creeping up onto the mounting surface.

According to at least one embodiment of the component, the mounting surface has the highest vertical elevation of the free area and/or of the bottom surface. In other words, the free area of the base body and/or the bottom surface of the cavity do/does not comprise a partial region that is on the same vertical level as the mounting surface and/or projects vertically beyond the mounting surface. The mounting surface can project beyond the boundary element in the vertical direction. Electromagnetic radiation emitted laterally from the semiconductor chip can impinge onto the reflective layer directly without being partially absorbed beforehand.

According to at least one embodiment of the component, the boundary element is an elevation on the free area and/or on the bottom surface. The boundary element is in particular a local vertical elevation. In particular, the mounting surface is laterally surrounded by the elevation completely. In particular, the boundary element protrudes beyond the mounting surface. The elevation has a vertical height which is, for example, between 10 μm and 200 μm inclusive, for instance between 10 μm and 100 μm inclusive. The boundary element thus has the effect of a dam that is configured to protect the mounting surface or the semiconductor chip from being covered by the material of the reflective layer.

According to at least one embodiment of the component, the boundary element is located between the mounting surface and a lateral margin line of the free area and/or a side wall of the cavity. The boundary element may be laterally spaced from the lateral margin line or from several, for instance from all margin lines of the free area, or from the side wall of the cavity or from several, for instance from all the side walls of the cavity. Alternatively, if the boundary element is a recess, the recess may extend along a lateral direction from the mounting surface as far as a lateral margin line of the free area and/or as far as a side wall of the cavity.

According to at least one embodiment of the component, the boundary element is laterally spaced from the semiconductor chip. In a plan view of the free area or of the bottom surface, the boundary element and the semiconductor chip are thus free of overlaps. The mounting surface can be completely surrounded by the boundary element in lateral directions. In a plan view of the free area, the semiconductor chip and the reflective layer can be free of overlaps.

According to at least one embodiment of the component, the reflective layer has a matrix material and white particles embedded therein. In particular, at least 30% by volume and/or weight of the reflective layer may be accounted for by the white particles. The matrix material can contain silicone or consist of silicone. The white particles are preferably titanium oxide particles, such as $TiO_2$ particles, which are embedded in a matrix material preferably made of silicone.

A reflective layer formed from $TiO_2$ is particularly suitable for reflecting visible light, especially blue light. It has been shown that silver layers can have a reflectance of up to 96% or 98% with respect to electromagnetic radiation in the visible spectral range, for example, with respect to the reflection of white light. Using $TiO_2$ particles, a reflectance of up to 96% can be achieved. In the blue spectral range, the silver layers can have a reflectance of up to 95%. Using $TiO_2$ particles, however, a reflectance of the reflective layer with respect to electromagnetic radiation in the blue spectral range of up to 98% and higher can be achieved. Compared to a silver layer, the reflectance of a $TiO_2$-based reflective layer can be increased by about 3-4%. Moreover, such a reflective layer is hardly susceptible to corrosion.

According to at least one embodiment of the component, the semiconductor chip is a volume emitter, wherein during operation of the component, electromagnetic radiation generated by the semiconductor chip can be coupled out from the semiconductor chip via a front side facing away from the mounting surface and via all side surfaces of the semiconductor chip. Since the entire surface of the semiconductor chip is free of a reflective material, the electromagnetic radiation can be coupled out from the semiconductor chip essentially without absorption or reflection losses.

The semiconductor chip can have a carrier and a semiconductor body arranged thereon. The carrier can be radiation-transmissive. For example, the carrier is a sapphire substrate. The semiconductor body can be based on a III-V or II-VI compound semiconductor material. In particular, the semiconductor chip has an optically active zone that is configured to emit electromagnetic radiation in the visible, ultraviolet or infrared spectral range.

According to at least one embodiment of the component, the housing has at least one or several leadframes. In particular, the leadframes are made of a metal, for example, of copper. The base body of the housing can form a leadframe. For example, the further base body forms a further leadframe of the housing. The leadframe and the further leadframe can be assigned to different electrical polarities of the component.

The leadframe and the further leadframe can be surrounded by the shaped body in such a way that a surface of the housing facing the semiconductor chip, in particular the bottom surface of the cavity, is formed regionally by surfaces of the leadframe and regionally by surfaces of the shaped body. In particular, the housing has exactly two leadframes, each of which is assigned to one of the electrical polarities of the component. It is possible for the leadframe, which is formed for instance by the base body of the housing, to have a free area that encompasses the entire mounting surface. In a plan view, the radiation-emitting semiconductor chip or the plurality of radiation-emitting semiconductor chips arranged on the mounting surface can have overlaps only with a single leadframe.

According to at least one embodiment of the component, the boundary element, in particular the recess of the boundary element, has an area of spreading or a plurality of areas of spreading. For example, the area of spreading is located at a corner region or at a side region of the mounting surface. The area of spreading can be rectangular, round or curved, at least in places. If the boundary element has a plurality of areas of spreading, the areas of spreading may be laterally spaced from each other. For example, the areas of spreading are located at different corner regions or at different side regions of the mounting surface. It is possible for the areas of spreading to be formed at least at two or at all corner regions and/or at least at two or at all side regions of the mounting surface.

In particular, the area of spreading is part of the recess and serves as a collecting basin for the material of the reflective layer. For example, the area of spreading has a lateral width which is at least 1.5 times, twice, three times or at least five times as large as a lateral width of the subregions of the recess adjacent to the area of spreading. The lateral width is determined in particular transversely or perpendicularly to the local orientation of the recess. For example, a ratio of the width of the area of spreading to the width of the subregions of the recess adjacent to the area of spreading is between 1.5 and 10 inclusive, for instance between 1.5 and 6 inclusive, for example, between 1.5 and 4 inclusive.

According to at least one embodiment of the component, the reflective layer has at least a first partial layer and a second partial layer. In particular, the first partial layer does not cover or only partially covers the boundary element, in particular the recess. Outside the mounting surface and the recess, the first partial layer may partially or completely cover the free area and/or the side walls of the cavity. The second partial layer can partially or completely cover the boundary element, in particular the recess. The second partial layer can completely fill the recess. In particular, the second partial layer is directly adjacent to the first partial layer.

For example, the reflective layer is produced in a two-step process. In particular, the first partial layer of the reflective layer is stopped at an outer edge of the boundary element, in particular of the recess. The boundary element can be free of a material of the first partial layer. However, it is possible that the boundary element formed as a recess is partially covered by the first partial layer.

After the formation of the first partial layer, in particular after the curing of the material of the first partial layer, the second partial layer can be applied onto the boundary element, in particular onto the recess. The recess may be completely covered by the second partial layer. For example, the material of the second partial layer is introduced into the recess at an area of spreading or at the areas of spreading. The area of spreading or the plurality of areas of spreading thus facilitates the filling of the recess. The second partial layer can directly adjoin the first partial layer. It is possible that the first partial layer is partially covered by the second partial layer when viewed from above. The first partial layer and the second partial layer can be made of the same material or of different materials. The first partial layer and the second partial layer may differ from each other in their material composition, viscosity and/or wettability.

In at least one embodiment of a method for producing a component, the semiconductor chip is attached to the mounting surface. Preferably, the free area or the bottom surface is partially covered by the reflective layer only after the semiconductor chip has been attached.

Furthermore, it is preferred that the reflective layer is applied for instance onto the side walls of the cavity only after the semiconductor chip has been attached to the mounting surface. The application of the reflective layer onto the free area and/or onto the bottom surface and/or onto the side walls of the cavity can be carried out in a common process step. For example, a material of the reflective layer is sprayed or injected onto the free area of the base body or the further base body and/or onto the bottom surface and/or onto the side walls of the cavity. After the reflective layer has been formed, electrical conductor tracks, which are arranged or formed on the free area or on the bottom surface may be partially or completely covered by the reflective layer.

According to at least one embodiment of the method, a material of the reflective layer is applied in liquid form, in particular in viscous form, onto the free area or onto the bottom surface and/or onto the side walls of the cavity. The material of the reflective layer may contain white particles, wherein at least 30% by volume and/or weight of the reflective layer may be accounted for by the white particles. The proportion of white particles may be between 30% and 90% inclusive, 30% and 70%, 30% and 50%, 40% and 60% inclusive, or between 40% and 80% inclusive of the volume and/or weight of the reflective layer.

The method described above is particularly suitable for the production of a component described here. The features described in connection with the component can therefore be used for the method and vice versa.

BRIEF DESCRIPTION OF THE DRAWINGS

Further advantages, preferred embodiments and further developments of the component or of the method will become apparent from the exemplary embodiments explained below in conjunction with FIGS. 1A to 3D and 4A to 4C.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

Figure 1A:
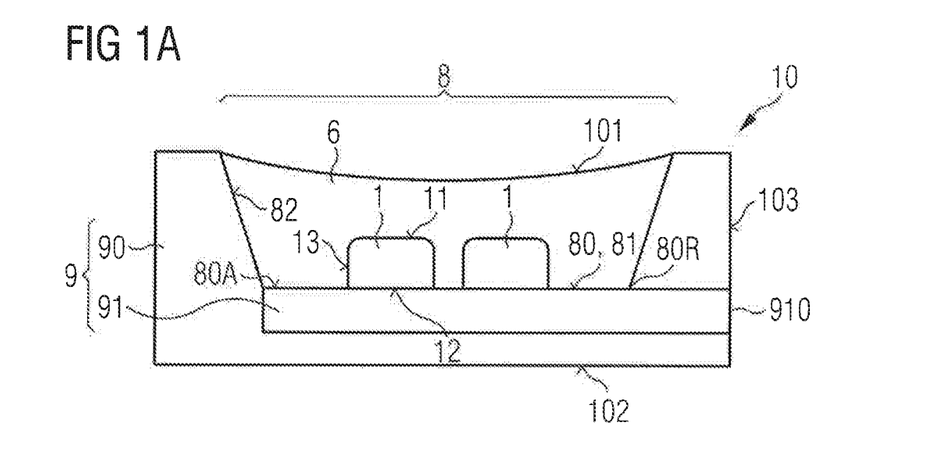
FIGS. 1A and 1B show schematic illustrations of comparative examples for a component without a boundary element.

FIG. 1A schematically shows a comparative example for a component 10 having a housing 9 and at least one semiconductor chip 1 along a cutting line AA' (see FIGS. 1B and 2B), wherein the semiconductor chip 1 is arranged in a cavity 8 of the housing 9.

The housing 9 has a base body 91 and a shaped body 90. A bottom surface 80 of the cavity 8 is formed in particular by a surface of the base body 91, for instance by a free area 80A of the base body 91, wherein in a plan view, the free area 80A or the bottom surface 80 is not covered by the shaped body 90. The free area 80A or the bottom surface 80 is delimited in one or several lateral directions by one or several margin lines 80R or by one or several side walls 82 of the cavity 8. The side walls 82 of the cavity 8 are formed in particular by inclined surfaces of the shaped body 90. The side walls 82 may have an angle of inclination to the bottom surface 80 between 20° and 70° inclusive, for instance between 30° and 60°, inclusive.

The free area 80A or the bottom surface 80 has a mounting area 81, on which the semiconductor chip 1 is arranged. The component 10 can have several semiconductor chips 1 arranged next to each other on the mounting surface 81. In particular, the semiconductor chips 1 are configured to generate electromagnetic radiation. The semiconductor chips 1 can be connected in series or parallel to each other. The semiconductor chips 1 each have a front side 11 facing away from the mounting surface 81, a rear side 12 facing the mounting surface 81 and side surfaces 13. In particular, the semiconductor chip 1 or the semiconductor chips 1 is/are (a) light-emitting diode/s. Electromagnetic radiation generated by the semiconductor chip 1 during operation of the component 10 can be coupled out from the semiconductor chip 1 via the front side 11 and/or the side surfaces 13 of the semiconductor chip 1.

The cavity 8 is filled in particular by a coating 6. In a plan view, the coating can completely cover the semiconductor chip 1 or the semiconductor chips 1. The coating may contain phosphors that convert short-wave spectral ranges of the radiation emitted by the semiconductor chip 1 into long-wave spectral ranges of electromagnetic radiation. In addition or alternatively, the coating 6 may contain scattering particles.

The component 10 has a front side 101, a rear side 102 and side surfaces 103. The light generated during operation of the component 10 can be coupled out from the component 10 at the front side 101. For increasing the efficiency of the component 10, inner surfaces of the cavity 8 can be configured to reflect radiation. For this purpose, a material of the shaped body 90 can have reflective or scattering particles, so that the side walls 82 of the cavity 8 are configured to be reflective. However, since the material of the shaped body 90 has to meet further requirements, particularly with regard to mechanical stability, only an insufficient degree of reflection is achieved at the side walls 82. For increasing the reflectivity of the bottom surface 80, it can alternatively be coated with a reflective metal layer. However, metal layers are susceptible to corrosion, so that the degree of reflection of the bottom surface decreases rapidly over time. In addition, a metal coating of the bottom surface 80 and/or of the side walls 82 can lead to an increased risk of short circuits.

Figure 1B:
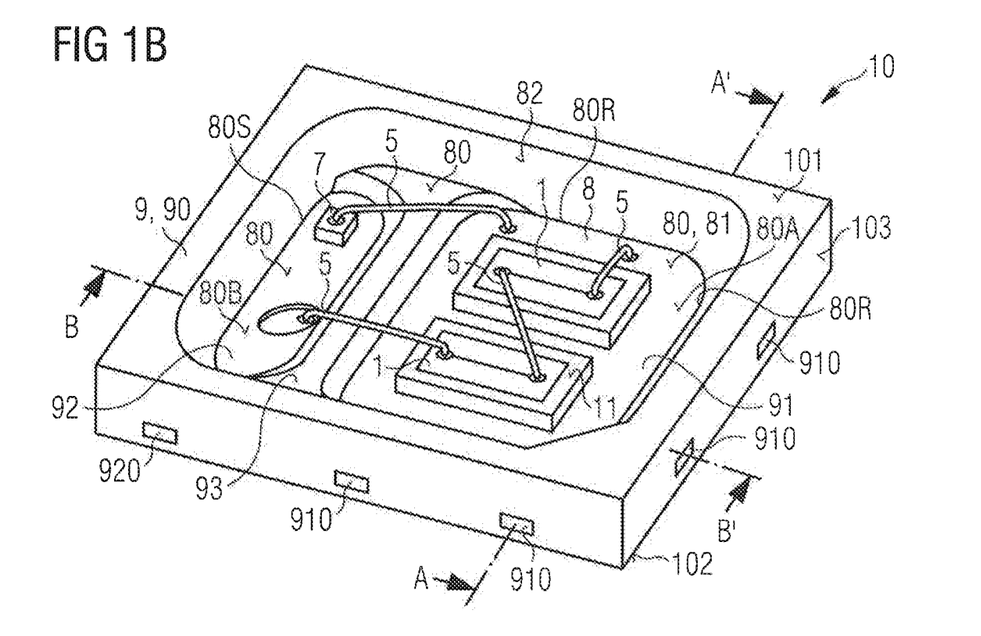

The exemplary embodiment for a component 10 shown in FIG. 1B essentially corresponds to the exemplary embodiment shown in FIG. 1A. In contrast to this, FIG. 1B shows that the housing 9 has a second base body 92 in addition to the first base body 91. In particular, the base bodies 91 and 92 are assigned to different polarities of the component 10. The first base body 91 and the second base body 92 can form a first leadframe 91 or a second leadframe 92 of the housing 9.

The base bodies 91 and 92 are surrounded by the shaped body 90 in such a way that the base bodies 91 and 92 are held together by the shaped body 90. In particular, the shaped body 90 has an intermediate region 93 which is arranged between the base bodies 91 and 92 and mechanically connects the first base body 91 to the second base body 92. The first base body 91 has a first free area 80A. The second base body 92 has a further, namely a second free area 80B. The further free area 80B is delimited for instance in one or several lateral directions by one or several margin lines 80S or by one or several side walls 82 of the cavity 8.

In a plan view, the free areas 80A and 80B are not covered by the shaped body 90. The first base body 91 and/or the second base body 92 can have further partial surfaces which adjoin the free area 80A or 80B and are covered by the shaped body 90. The first base body 91 and/or the second base body 92 can extend laterally into the shaped body 90 and be anchored to the shaped body 90.

The bottom surface 80 of the cavity 8 is formed regionally by surfaces of the base bodies 91 and 92 and regionally by surfaces of the intermediate region 93 of the shaped body 90. As shown in FIG. 1B, the intermediate region 93 forms a local vertical elevation within the cavity 8. The intermediate region 93 extends along a lateral direction between two opposite side walls 82 of the cavity 8. If a reflective material is applied onto the side walls 82, the intermediate region 93 of the shaped body 90 cannot prevent the reflective material from reaching the mounting surface 81 or the semiconductor chips 1. Thus, the intermediate region 93 shown in FIG. 1B is not to be regarded as a boundary element.

The first base body 91 and the second base body 92 can be electrically contacted externally, in particular via the first connection point(s) 910 and/or the second connection point(s) 920 on the side surfaces 103 of the component 10 or of the housing 9. Deviating from this, it is possible that the connection point(s) 910 and/or 920 are/is freely accessible at the rear side 102, in particular exclusively at the rear side 102 of the component 10, so that the component 10 is electrically connectable via the rear side 102.

A surface of the first base body 91 exposed within the cavity 8 forms the mounting surface 81 for the semiconductor chips 1. The component 10 has a protective diode 7 which is arranged within the cavity 8 on a second free area 80B of the second base body 92. The protective diode 7 is not arranged on the mounting surface 81 for the semiconductor chips 1 but on the second free area 80B of the second base body 92, wherein the second free area 80B is different from the first free area 80A comprising the mounting surface 81. The first free area 80A and the second free area 80B are laterally spaced apart from each other in particular by the intermediate region 93 of the shaped body 90. The second free area 80B is delimited in lateral directions by further margin lines 80S, wherein the further margin lines 80S are boundary lines between the second free area 80B and the shaped body. The semiconductor chips 1 and the protective diode 7 can be electrically connected to the base bodies 91 and 92 via electrical connections 5 for instance in the form of bonding wires. For example, the protective diode 7 is connected in parallel or anti-parallel to the semiconductor chips 1.

Figure 2A:
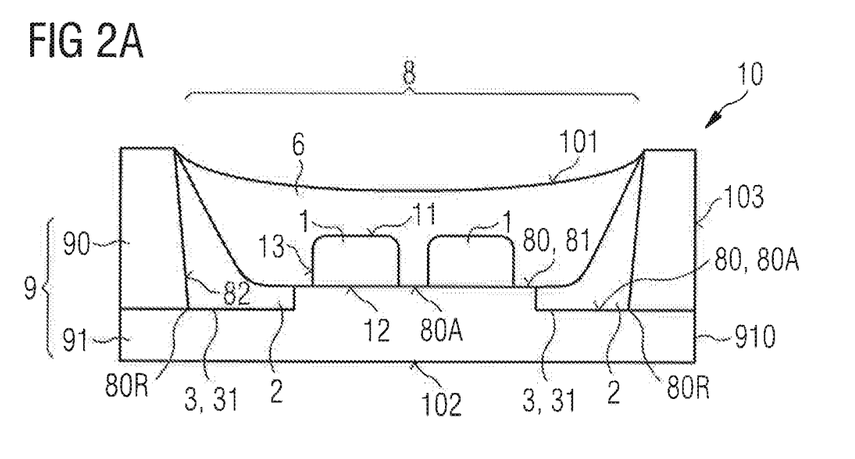
FIGS. 2A and 2B show schematic illustrations of exemplary embodiments for a component having a boundary element.

The exemplary embodiment for a component 10 shown in FIG. 2A along a cutting line AA' (see FIG. 2B) essentially corresponds to the exemplary embodiment shown in FIG. 1A. All features disclosed in connection with FIG. 1A can therefore be used for the exemplary embodiment shown in FIG. 2A.

In contrast to FIG. 1A, the component 10 shown in FIG. 2A has a boundary element 3. The boundary element 3 is a recess 31 which—in a plan view of the bottom surface 80—completely or partially encloses the mounting surface 81. The mounting surface 81 adjoins in particular directly to an edge of the recess 31. The bottom surface 80 has one step having an upper terrace formed by the mounting surface 81 and a lower terrace formed by the surface of the recess 31. For example, a vertical distance between the upper and the lower terraces is between 10 μm and 200 μm inclusive, for instance between 10 μm and 100 μm inclusive.

As shown in FIG. 2A, the side walls 82 of the cavity 8 are covered, in particular completely covered by a reflective layer 2. The reflective layer 2 partially or completely covers the free area 80A and/or the bottom surface 80 especially in the regions of the recess/recesses 31. The mounting surface 81 and/or the semiconductor chip 1 or the semiconductor chips 1 are free of a covering by the reflective layer 2. Due to the edges or steps formed on the mounting surface 81, the boundary element 3 prevents the material of the reflective layer 2 from creeping onto the mounting surface 81 or onto the semiconductor chips 1.

The reflective layer 2 can have a matrix material and white particles embedded therein. The proportion of white particles may be at least 30%, 40%, 50%, 60%, 70% or up to 90% of the volume and/or weight of the reflective layer 2. The matrix material can contain silicone or consist of silicone. The white particles may contain one of the following materials $TiO_2$, $BaSO_4$, $ZnO$, alumina or $ZrO_2$ or consist of one of these materials. The proportion of white particles can be adjusted in such a way that the reflective layer has a reflectance of at least 70%, 80%, 90%, 95% or at least 98% with respect to visible light.

The coating 6 and/or the reflective layer 2 may contain silicone. The coating 6 directly adjoins the reflective layer 2. In this case, the adhesion between the coating 6 and the reflective layer 2 is increased in comparison with the adhesion between the coating 6 and the shaped body 90, which usually has an epoxy material. However, it is also possible that the material of the shaped body 90 is a mixture of a silicone and an epoxy, namely a so-called silicone-epoxy hybrid material or a so-called silicone-mold-compound of silicone and white reflective fillers. If a reflective layer 2 is arranged on the side walls 82, the shaped body 90 can be free of reflective particles.

According to FIG. 2A, the base body 91 is externally electrically connectable at a first connection point 910 on the side surface 103 of the housing 9 or of the component 10. Along the lateral direction, the base body 91 can thus extend throughout the shaped body 90. It is also possible for the base body 91 to extend along the vertical direction throughout the shaped body 90 so that the base body 91 is electrically connectable particularly at the rear side 102 of the housing 9 or of the component 10.

Figure 2B:
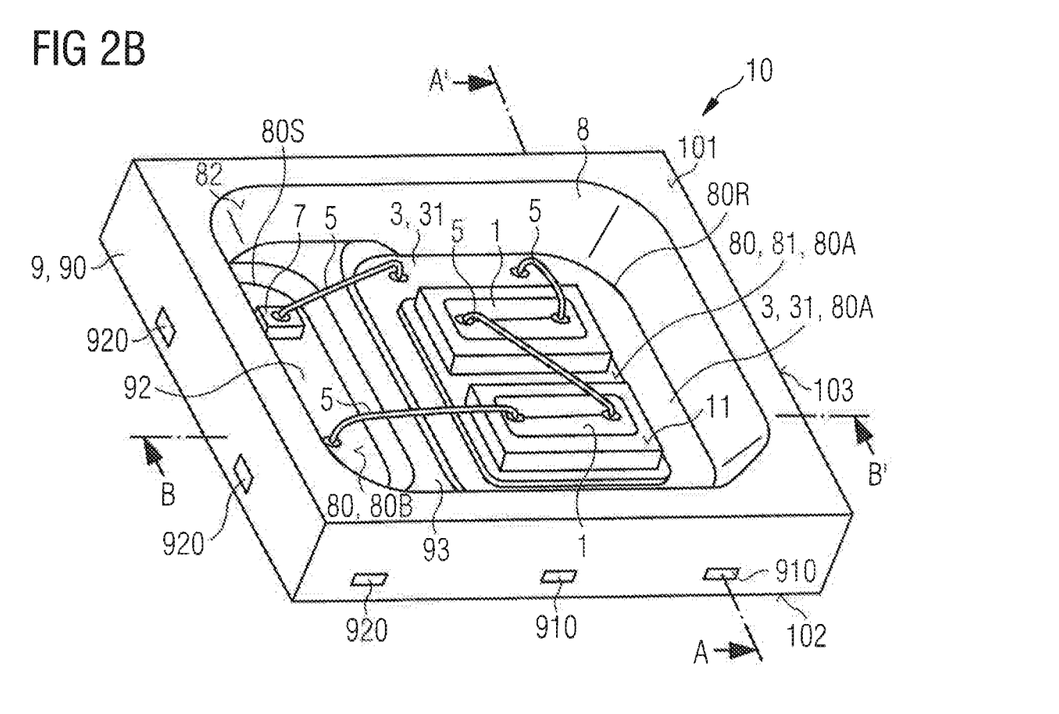

The exemplary embodiment for a component 10 shown in FIG. 2B essentially corresponds to the exemplary embodiment shown in FIG. 1B. All features disclosed in connection with FIG. 1B can be used for the component 10 shown in FIG. 2B and vice versa. In contrast to FIG. 1B, the component 10 shown in FIG. 2B has a boundary element 3 in particular in the form of a recess 31. Compared to the recess 31, the mounting surface 81 is vertically elevated. The recess 31 can be formed by an etching process. The etching depth can be between 10 µm and 200 µm inclusive, for instance between 10 µm and 100 µm inclusive, for example, about 50 µm.

As shown in FIG. 2B, the recess 31 extends along the lateral directions from the mounting surface 81 to the side walls 82 of the cavity 8 or to the first margin lines 80R of the first free area 80A. The first margin lines 80R are in particular boundary lines between the first free area 80A and the shaped body 90. The recess 31 extends along one lateral direction between the mounting surface 81 and the intermediate region 93 of the shaped body 90. If the side walls 82 and the bottom surface 80 of the cavity or the free area 80A are covered with a reflective material, the recess 31 can serve as a collecting basin for the reflective material and thus prevent the reflective material from reaching the mounting surface 81 or the semiconductor chips 1.

All side walls 82 of the cavity 8 may be partially or completely covered by the reflective layer 2. Besides the mounting surface 81 for the semiconductor chips 1, the bottom surface 80 or the free area 80A can be completely covered by the reflective layer 2. For reasons of clarity, the reflective layer 2 is not shown in FIG. 2B. In particular, at least 10%, 20%, 30% or at least 40% of the total bottom surface 80 or of the free area 80A may be covered by the reflective layer 2. For example, the covered proportion of the bottom surface 80 or of the free area 80A may be between 10% and 70% inclusive or between 10% and 50% inclusive.

Figure 3A:
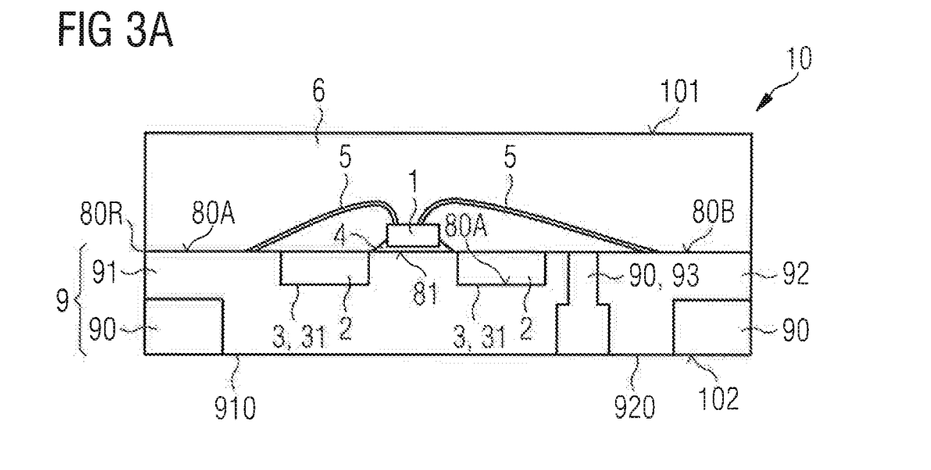
FIGS. 3A, 3B, 3C and 3D show schematic illustrations of further exemplary embodiments for a component having a boundary element.

FIG. 3A shows a component 10 according to another exemplary embodiment. In this case, the shaped body 90 encloses the base body/bodies 91 and/or 92 in particular in such a way that the shaped body 90, for instance the intermediate region 93, and the base body/bodies 91 and/or 92 have substantially the same vertical heights. For example, along the lateral direction, the first free area 80A and/or the second free area 80B are/is flush with the shaped body 90 or with the intermediate region 93 of the shaped body 90. In particular, the shaped body 90 is free of a cavity in which the semiconductor chip 1 is arranged. In other words, the shaped body 90, especially at its edges, does not project beyond the first free area 80A and/or the second free area 80B.

The first base body 91 and/or the second base body 92 can have a partial region which extends throughout the shaped body 90 and is electrically connectable at the rear side 102 of the housing 9 or of the component 10. As shown in FIG. 3A, the component 10 has a first connection point 910 and a second connection point 920 on the rear side 102. The first connection point 910 is in particular part of the first base body 91, the second connection point 920 is in particular part of the second base body 92.

In deviation from FIG. 3A, it is possible that the shaped body 90 completely surrounds the first base body 91 and/or the second base body 92 in the lateral directions such that the side surfaces 103 of the component 10 are free of the first base body 91 and/or of the second base body 92. The component 10 can be externally electrically connectable only at the rear side 102 via the first connection point 910 and/or via the second connection point 920. In addition, it is also possible for the shaped body 90 to be flush with the first base body 91 and/or with the second base body 92 at the margin lines 80R and/or 80S. In this case, the shaped body 90 and the first base body 91 and/or the second base body 92 can have the same vertical height at the margin lines 80R and/or 80S.

According to FIG. 3A, the mounting surface 81 is formed exclusively by a surface of the first base body 91. In particular, the first free area 80A is formed by the entire surface of the first base body 91 facing the semiconductor chip 1. The lateral expansion of the first free area 80A is limited by the first margin lines 80R and the intermediate region 93 of the shaped body 90. The second free area 80B can be formed by the entire surface of the second base body 92 facing the semiconductor chip 1. The lateral extent of the second free area 80B is limited by the second margin lines 80S and the intermediate region 93 of the shaped body 90.

The boundary element 3 in FIG. 3A is a local vertical recess 31 of the first base body 91. In a plan view of the first free area 80A, the local recess 31 is laterally spaced apart from the intermediate region 93 of the shaped body 90, from the second base body 92 or from all margin lines 80R. The reflective layer 2 is located only in the regions of the local recess 31 or of the local recesses 31. The local recess 31 or the plurality of recesses 31 can be contiguous. In a plan view of the first free area 80A, the local recess 31 can completely or partially enclose the mounting surface 81.

According to the exemplary embodiment for a component 10 shown in FIG. 3A, the semiconductor chip 1 is attached to the mounting surface 81 by means of a connecting layer 4. The connecting layer 4 is, for example, an adhesive layer or a bonding layer. The connecting layer 4 can be electrically insulating. The semiconductor chip can be electrically connected to the base bodies 91 and 92 via electrical connections 5, in particular in the form of bonding wires 5.

Figure 3B:
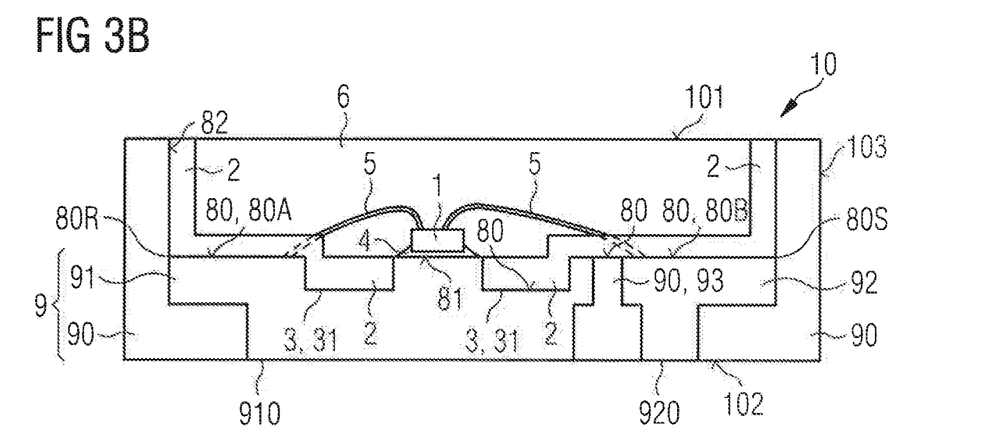

The exemplary embodiment for a component 10 shown in FIG. 3B essentially corresponds to the exemplary embodiment shown in FIG. 3A. In contrast to this, the shaped body 90 has a cavity 8. The component 10 shown in sectional view in FIG. 3B can be the component 10 shown in FIG. 2B along the cutting line BB'. The reflective layer 2 covers in particular not only the local recess 31, but also other regions of the bottom surface 80 or of the free area 80A outside the mounting surface 81. The reflective layer 2 can partially or completely cover the intermediate region 93 of the shaped body 90 and/or a second free area 80B of the second base body 92 located inside the cavity 8. All side walls 82 may also be partially or completely covered by the reflective layer 2. The reflective layer 2 can be formed to be contiguous.

In FIG. 3B, the side walls 82 are oriented essentially perpendicular to the bottom surface 80. In deviation from this, it is also possible for the side walls 82 to have an angle of inclination for instance between 20° and 70° with respect to the bottom surface 80. In contrast to FIGS. 3A and 3B, it is also possible for the semiconductor chip 1 to be electrically connectable for instance partially via its rear side 12. In this case, the semiconductor chip 1 can be electrically connected to the first base body 91 by an electrically conductive connecting layer 4. For example, the connecting layer 4 is a solder layer.

Figure 3C:
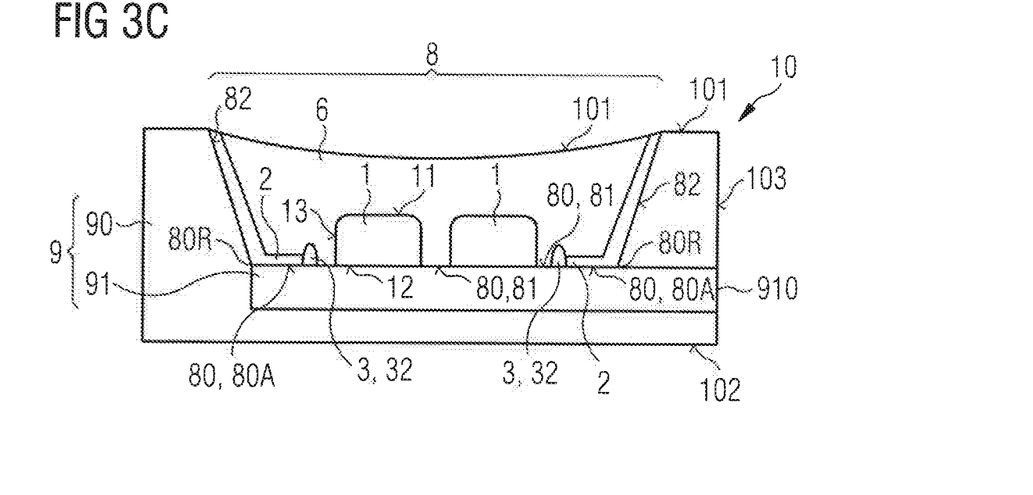

The exemplary embodiment for a component 10 shown in FIG. 3C essentially corresponds to the exemplary embodiment shown in FIG. 1A. In contrast to this, the component 10 has a boundary element 3 on the bottom surface 80 of the cavity 8 or on the free area 80A. The boundary element 3 is a local elevation 32. The local elevation 32 can completely or partially enclose the mounting area 81. The local elevation 32 can have a vertical height between 10 µm and 200 µm inclusive. Along the vertical direction, the local elevation protrudes in particular over the free area 80A or over the bottom surface 80 and/or over the mounting area 81. The local elevation 32 may have a mushroom-like structure. The local elevation 32 has the function of a dam that keeps a material of reflective layer 2 away from the mounting surface 81 or from the semiconductor chips 1.

The local elevation 32 can have a material that is different from the material of the base body 91. For example, the local elevation 32 can be a lacquer layer. Alternatively, it is also possible that the local elevation 32 is part of the base body 91. Together, the local elevation 32 and the base body 91 can be formed in one piece. For example, the base body 91 is etched in such a way that it comprises the local elevation 32.

According to FIG. 3C, the reflective layer 2 completely covers the side walls 82 of the cavity 8. The reflective layer 2 adjoins the free area 80A, the bottom surface 80, the boundary element 3, the coating 6 and the side walls 82. In particular, the reflective layer 2 and the shaped body 90 are made of different materials. In particular, the material of the shaped body 90 is free of white particles, which are particularly contained in the reflective layer 2.

Figure 3D:
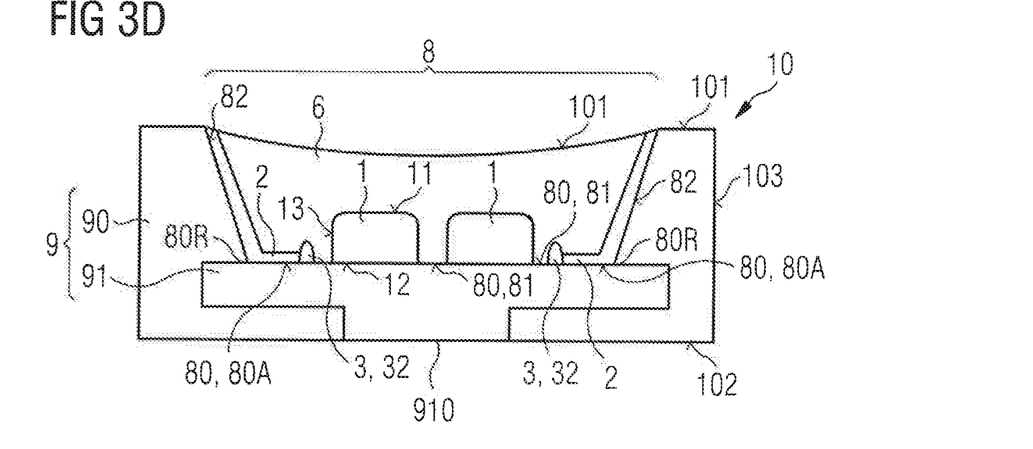

The exemplary embodiment shown in FIG. 3D essentially corresponds to the exemplary embodiment for a component 10 shown in FIG. 3C. Unlike FIG. 3C, wherein the component 10 is electrically connectable at a first connection point 910 on the side surface 103, according to FIG. 3D, the first connection point 910 is located at the rear side 102 of the component 10. The first base body 91 can have a partial region which extends in the vertical direction throughout the shaped body 90 and is freely accessible at the rear side 102 of the housing 9 or of the component 10. In lateral directions, the first base body 91 can be completely enclosed by the shaped body 90. The component 10 can have a second base body 92 which is formed similar to the first base body 91 and has a second connection point 920 at the rear side 102.

Figure 4A:
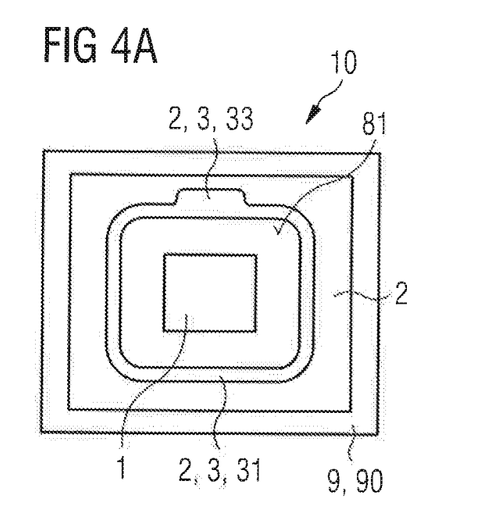
FIGS. 4A, 4B and 4C show schematic illustrations of further exemplary embodiments for a component having a boundary element.

FIG. 4A shows the component 10 in a plan view. In particular, the exemplary embodiment shown in FIG. 4A corresponds to the exemplary embodiment for a component 10 shown in FIG. 3B. According to FIG. 4A, the boundary element 3, in particular the recess 31, has an area of spreading 33. The area of spreading 33 is thus a local spreading of the recess 33. The area of spreading 33 is arranged on one side region of the mounting surface 81. In contrast to FIG. 4A, the boundary element 3 can have a plurality of areas of spreading 33.

Figure 4B:
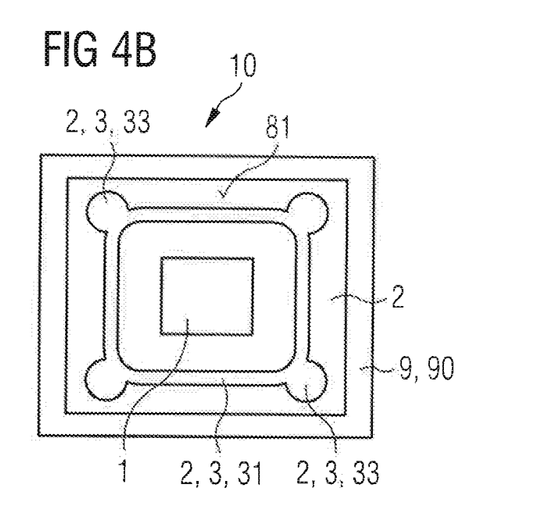

The exemplary embodiment shown in FIG. 4B essentially corresponds to the exemplary embodiment shown in FIG. 4A. In contrast, the recess 31 has a plurality of areas of spreading 33 which are formed at the corner regions of the mounting surface 81. In contrast to FIGS. 4A and 4B, the boundary element 3 can have areas of spreading 33 both on the side regions and on the corner regions of the mounting surface 81.

Figure 4C:
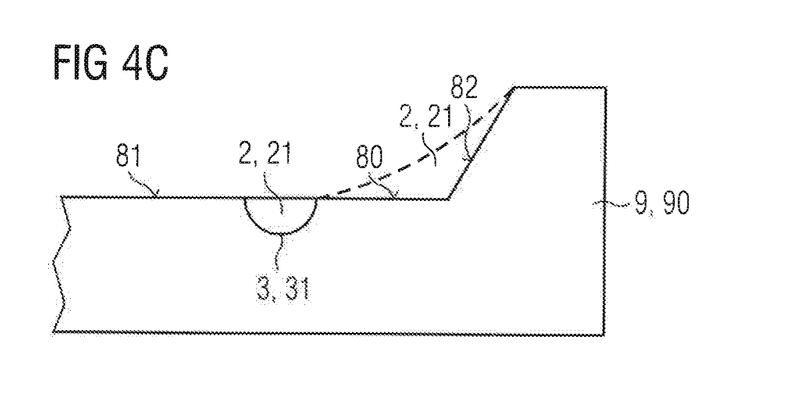

According to FIG. 4C, the reflective layer 2 has a first partial layer 21 and a second partial layer 22. In particular, the first partial layer 21 adjoins the recess 31. Alternatively, the first partial layer 21 may partially cover the recess 31. Outside the mounting surface 81 and the recess 31, the first partial layer 21 can partially or completely cover the free area 80A of the base body 91 or of the shaped body 90 and/or the side walls 82 of the cavity. The second partial layer 22 may partially or completely cover or fill the recess 31, in particular the area of spreading 33 or the areas of spreading 33. The first partial layer 21 and the second partial layer 22 can be made of the same material or of different materials.

By means of a boundary element surrounding a mounting surface, a reflective material can be reliably applied onto areas around the mounting surface without the reflective material reaching the mounting surface. Before the reflective layer has been formed, a semiconductor chip, which is in particular a volume emitter, can be attached to the mounting surface without the risk of being covered by the reflective material of the reflective layer.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

What is claimed is:

1. A component comprising:
a semiconductor chip;
a housing; and
a reflective layer,
wherein the housing has a shaped body and a base body,
wherein the shaped body laterally encloses the base body at least in places and is different from the reflective layer,
wherein, in plan view, the base body has a free area which is not covered by the shaped body and comprises a mounting surface for the semiconductor chip,
wherein the semiconductor chip is arranged on the mounting surface,
wherein the free area is partially covered by the reflective layer,
wherein the mounting surface is enclosed at least in regions by a boundary element which adjoins the reflective layer and is configured to prevent the semiconductor chip from being covered by the reflective layer,
wherein the boundary element is a recess on the free area and in plan view of the free area, the recess completely enclosing the mounting surface,
wherein the boundary element is located between the mounting surface and a lateral margin line of the free area,
wherein the boundary element is laterally spaced from the lateral margin line of the free area, and
wherein, in plan view, the reflective layer completely covers the recess.

2. The component according to claim 1, wherein the mounting surface is connected to a bottom surface of the recess via an intermediate surface extending along a vertical direction, and wherein the intermediate surface is convexly or concavely curved.

3. The component according to claim 1, wherein the mounting surface is connected to a bottom surface of the recess via an intermediate surface extending along a vertical direction, and wherein the intermediate surface forms an acute angle with the bottom surface of the recess covered by the reflective layer.

4. The component according to claim 1, wherein the shaped body has a cavity and the free area forms a bottom surface of the cavity at least in places.

5. The component according to claim 1, wherein the shaped body laterally surrounds the base body in such a way that the shaped body and the base body have at least in places the same vertical height or that the shaped body is flush with the base body along at least one lateral direction.

6. The component according to claim 1, wherein the recess of the boundary element has an area of spreading which is located at a corner region or at a side region of the mounting surface.

7. The component according to claim 6, wherein the area of spreading serves as a collecting basin for a material of the reflective layer and the area of spreading has a lateral width which is at least 1.5 times as large as a lateral width of subregions of the recess adjacent to the area of spreading.

8. The component according to claim 1,
wherein the reflective layer comprises a first partial layer and a second partial layer, wherein the first partial layer does not cover or only partially covers the recess and—outside the mounting surface and the recess—completely covers the free area, and
wherein the second partial layer fills the recess and directly adjoins the first partial layer.

9. The component according to claim 1, wherein the boundary element is laterally spaced from the semiconductor chip so that, in plan view of the free area, the boundary element and the semiconductor chip are free of overlaps.

10. The component according to claim 1, wherein the mounting surface is completely surrounded by the boundary element in lateral directions.

11. The component according to claim 1, wherein, in plan view of the free area, the semiconductor chip and the reflective layer are free of overlaps.

12. The component according to claim 1, wherein the reflective layer comprises a matrix material and white particles embedded therein, and wherein a proportion of at least 30 percent by volume and/or by weight of the reflective layer is accounted for by the white particles.

13. The component according to claim 12, wherein the matrix material is a silicone and the white particles are $TiO_2$ particles.

14. The component according to claim 1, wherein the semiconductor chip is a volume emitter, and wherein the semiconductor chip is configured to couple out electromagnetic radiation generated by the semiconductor chip via a front side facing away from the mounting surface and via all side surfaces of the semiconductor chip.

15. The component according to claim 1, wherein the base body is surrounded by the shaped body in such a way that along a lateral direction the free area is flush with the shaped body in regions.

16. A method for producing the component according to claim 1, the method comprising:
fixing the semiconductor chip to the mounting surface; and
covering the free area in places by the reflective layer only after the semiconductor chip has been fixed.

17. The method according to claim 16, further comprising:
forming the shaped body such that it has a cavity; and
after the semiconductor chip has been fixed to the mounting surface, applying the reflective layer onto side walls of the cavity.

18. The method according to claim 16, further comprising applying a material of the reflective layer in liquid form onto the free area and/or onto side walls of a cavity formed in the shaped body, wherein the material of the reflective layer comprises white particles, and wherein a proportion of at least 30 percent by volume and/or by weight of the reflective layer is accounted for by the white particles.

19. The component according to claim 1, wherein the recess has an area of spreading or a plurality of areas of spreading, and wherein the area of spreading is part of the recess and serves as a collecting basin for material of the reflective layer.

20. The component according to claim 19, wherein the area of spreading has a lateral width which is at least 1.5 times as large as a lateral width of subregions of the recess adjacent to the area of spreading.

* * * * *

UNITED STATES PATENT AND TRADEMARK OFFICE
CERTIFICATE OF CORRECTION

PATENT NO. : 10,854,787 B2  
APPLICATION NO. : 16/052511  
DATED : December 1, 2020  
INVENTOR(S) : Teik Yee Wong Page 1 of 1

It is certified that error appears in the above-identified patent and that said Letters Patent is hereby corrected as shown below:

On the Title Page

Item (73) Assignee, Line 1, delete "OSAM" and insert --OSRAM--.

Signed and Sealed this  
Second Day of February, 2021

Drew Hirshfeld  
*Performing the Functions and Duties of the*  
*Under Secretary of Commerce for Intellectual Property and*  
*Director of the United States Patent and Trademark Office*